US005747844A

United States Patent [19]
Aoki et al.

[11] Patent Number: 5,747,844
[45] Date of Patent: May 5, 1998

[54] DYNAMIC SEMICONDUCTOR MEMORY DEVICE WITH HIGHER DENSITY BIT LINE/ WORD LINE LAYOUT

[75] Inventors: Masami Aoki; Takashi Yamada, both of Yokohama, Japan; Hiroshi Takato, Wappingers Falls, N.Y.; Tohru Ozaki, Tokyo, Japan; Katsuhiko Hieda; Akihiro Nitayama, both of Wappingers Falls, N.Y.

[73] Assignee: Kabushiki Kaisha Toshiba, Kawasaki, Japan

[21] Appl. No.: 736,279

[22] Filed: Oct. 24, 1996

Related U.S. Application Data

[62] Division of Ser. No. 402,570, Mar. 13, 1995, Pat. No. 5,578,847, which is a continuation of Ser. No. 92,681, Jul. 16, 1993, abandoned.

[30] Foreign Application Priority Data

Jul. 17, 1992  [JP]  Japan ..................... 4-190994

[51] Int. Cl.[6] ........................ H01L 27/108
[52] U.S. Cl. .................. 257/296; 257/296; 257/907
[58] Field of Search ..................... 257/296, 907

[56] References Cited

U.S. PATENT DOCUMENTS

| | | | |
|---|---|---|---|
| 5,237,187 | 8/1993 | Suwanai et al. | 257/296 |
| 5,378,906 | 1/1995 | Lee | 257/907 |
| 5,383,151 | 1/1995 | Onishi et al. | 257/907 |
| 5,422,315 | 6/1995 | Kobayashi | 257/296 |
| 5,578,847 | 11/1996 | Aoki et al. | 257/296 |
| 5,610,418 | 3/1997 | Eimori | 257/296 |
| 5,614,745 | 3/1997 | Motonami | 257/296 |

Primary Examiner—Mahshid D. Saadat
Assistant Examiner—Ida Marie Soward
Attorney, Agent, or Firm—Oblon, Spivak, McClelland, Maier & Neustadt, P.C.

[57] ABSTRACT

A plurality of bit line contacts provided on one bit line BL are arranged on every other one of spaces each provided between every adjacent two of word lines WL and a plurality of bit line contacts provided on an adjacent bit line BL are arranged on every other one of spaces each provided between every adjacent two of word lines WL which is different from the space in which a corresponding one of the bit line contacts formed on the former bit line is arranged.

31 Claims, 15 Drawing Sheets

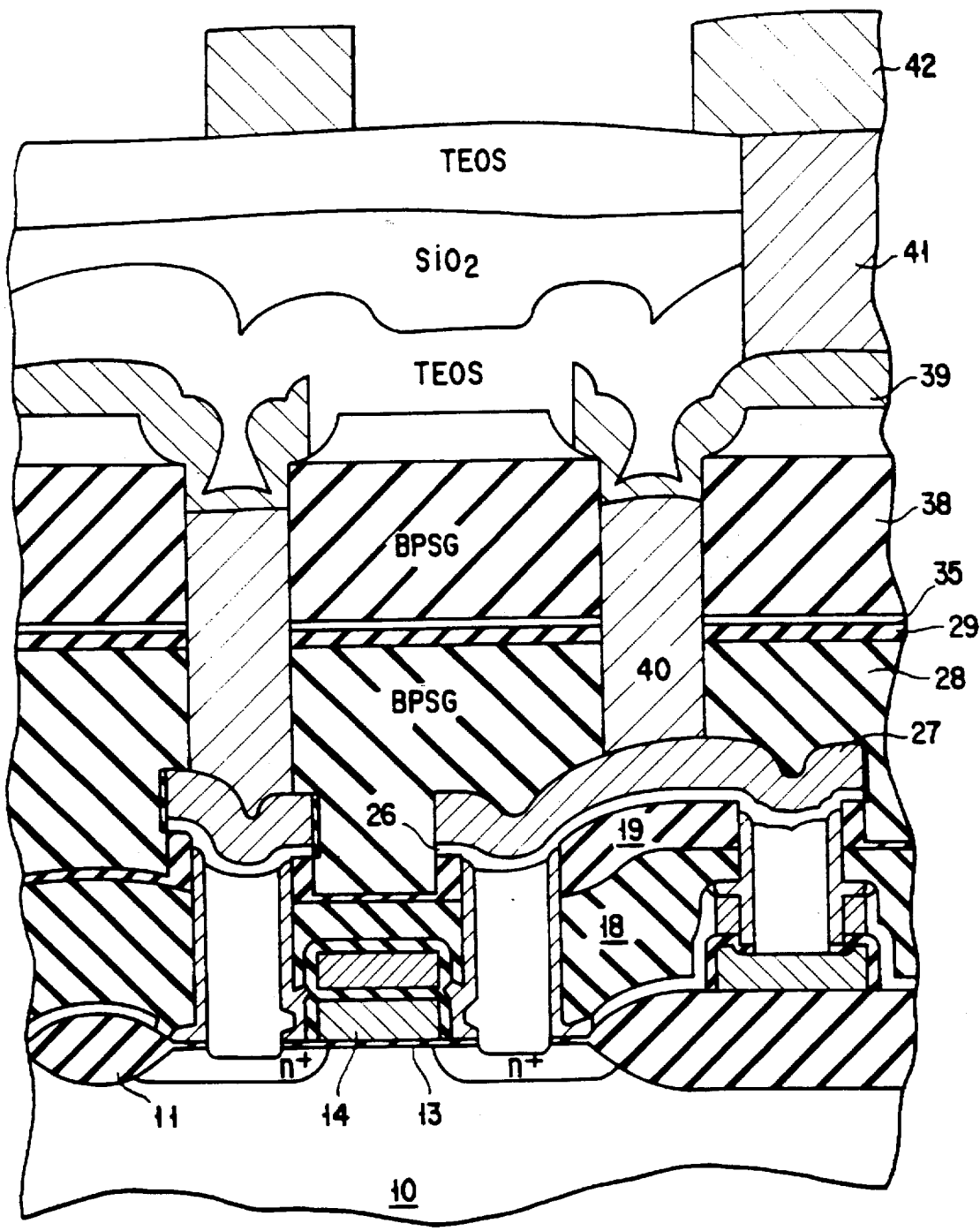
F I G. 16

DYNAMIC SEMICONDUCTOR MEMORY DEVICE WITH HIGHER DENSITY BIT LINE/ WORD LINE LAYOUT

This is a Division of application Ser. No. 08/402,570 filed on Mar. 13, 1995, U.S. Pat. No. 5,078,847 which is a Continuation of application Ser. No. 08/092,681 filed on Jul. 16, 1993, now abandoned.

BACKGROUND OF THE INVENTION

1. Field of the Invention

This invention relates to a dynamic semiconductor memory device, and more particularly to the arrangement of memory cells in a dynamic semiconductor memory device or the like.

2. Description of the Related Art

In recent years, with further development of the semiconductor technology, particularly, with further development of the fine patterning process in the semiconductor manufacturing process, the integration density of a so-called MOS dynamic semiconductor memory device (which is hereinafter referred to as DRAM) is rapidly enhanced. In order to attain a high integration density of the DRAM, it is necessary to densely arrange the memory cells with the least amount of space therebetween.

In FIG. 1, the layout of a cell array of folded bit line configuration is shown. In FIG. 1, word lines $WL_1$ to $WL_8$ are arranged to intersect bit lines $BL_1$ to $BL_5$ on a semiconductor substrate (not shown) and bit line contacts 1 are formed at a predetermined interval on each of the bit lines $BL_1$ to $BL_5$ with each of them lying between adjacent two of the word lines. In FIG. 1, the hatched portions indicate an active region 2.

It is assumed in the following description that the minimum featuring size is set to F and one word line pitch and one bit line pitch are each set to 2F which is twice the minimum featuring size.

As shown in FIG. 1, in the conventional cell array of folded bit line configuration, the minimum memory size becomes $8F^2$. That is, the minimum memory size is obtained by {two word line pitches (4F)}×{one bit line pitch (2F)}. The reason why the two word line pitches are necessary is that the passing word line is necessary in the folded bit line configuration.

FIG. 2 shows the layout of a cell array of open bit line configuration which does not require the passing word line as in the case of FIG. 1. In FIG. 2, portions which are the same as those of FIG. 1 are denoted by the same reference numerals and an explanation thereof is omitted.

As shown in FIG. 2, in the cell array of open bit line configuration, the cell array size is determined by $6F^2$ obtained by 1.5 word line pitch (3F)×one bit line pitch (2F) including the field isolation region. Therefore, since the size of the cell array of open bit line configuration shown in FIG. 2 becomes ¾ times the size of the cell array of folded bit line configuration shown in FIG. 1, a higher integration density can be attained in the open bit line configuration than in the folded bit line configuration.

However, the conventional open bit line configuration has the following problems.

A problem that the degree of freedom of the layout of a sense amplifier is small occurs. The reason is as follows. FIGS. 3 and 4 show the layouts of folded bit line configuration and open bit line configuration.

In the folded bit line configuration of FIG. 3, one sense amplifier can be arranged for every four bit line pitches (that is, 8F) by arranging sense amplifiers 4 on both sides of the cell array. In contrast, in the open bit line configuration, it becomes necessary to dispose a sense amplifier 4 in two bit line pitches (4F) as shown in FIG. 4. Therefore, in the open bit line configuration, the space for arrangement of sense amplifiers becomes small, making it difficult to design the sense amplifier.

As shown in FIG. 2, in the open bit line configuration, a space between the adjacent word lines is not constant and spaces of F and 3F are alternately provided. In the open bit line configuration, non-uniformity of spaces between the word lines causes a problem when a phase shift lithography method or the like is applied for patterning.

As described above, the layout of the conventional open bit line configuration has an advantage over the folded bit line configuration in that the cell area can be reduced to 75%. However, in the open bit line configuration, since the space of arrangement for the sense amplifiers becomes half in the bit line direction, the design for the sense amplifier becomes difficult, and since the spaces between word lines are not constant, the fine patterning process cannot be stably effected.

SUMMARY OF THE INVENTION

An object of the present invention is to provide a dynamic semiconductor memory device having an improved layout of open bit line configuration.

In order to solve the above problem, the following means is provided in the present invention.

A dynamic semiconductor memory device of the present invention is characterized by comprising a semiconductor substrate; a plurality of memory cells each formed of a MOS transistor and a capacitor formed on the semiconductor substrate; a plurality of word lines formed on the semiconductor substrate; a plurality of bit lines formed on the semiconductor substrate to intersect the word lines, the bit lines including at least adjacent first and second bit lines; a plurality of bit line contacts formed on the bit lines and each commonly used by two of the memory cells, each of the bit line contacts being arranged on every other one of a plurality of word line spaces formed between respective adjacent two of the word lines and the bit line contacts formed on the second bit line being provided in those spaces between the word lines in which no bit line contacts are provided on the first bit line, the arrangement pattern of the bit line contacts being continuously and repeatedly provided.

Further, the dynamic semiconductor memory device is characterized in that the bit lines and word lines are arranged at predetermined intervals. Also, the dynamic semiconductor memory device is characterized in that the bit lines and word lines perpendicularly intersect each other. The dynamic semiconductor memory device is characterized in that the interval between the adjacent bit lines is larger than the interval between the adjacent word lines, particularly, the former interval is 1.5 times the latter interval.

In the present invention, the interval between the adjacent word lines and the interval between the adjacent bit lines are set to constant values and bit line contacts formed on one of the bit lines are arranged at every two word line pitch between the adjacent word lines. Bit line contacts provided on a bit line adjacent to the above bit line are arranged at every two word line pitch in positions deviated by one word line pitch from the above bit line contacts. Therefore, when the closest filling is made according to the layout of the cell array of the present invention, the minimum area of the cell is set to one word line pitch (2F)×1.5 bit line pitch (3F), that is, $6F^2$.

According to the present invention, the bit line space can be set to 2F which is twice the minimum featuring size while the minimum cell area is set to $6F^2$ which is the same as the minimum cell area in the conventional open bit line configuration. Therefore, according to the present invention, the sense amplifier arrangement space which can be set only to 4F in the conventional open bit line configuration can be set to 6F which is 1.5 times that of the layout of cell arrays of conventional open bit line configuration. As described above, a sufficiently large arrangement space for sense amplifiers can be attained without increasing the cell area.

Further, according to the present invention, since the bit lines and word lines are arranged at equal intervals, the precise patterning and processing can be attained.

When the closest filling is effected according to the layout of the present invention, a space between the adjacent bit lines becomes twice that between the adjacent word lines, but since the pitch of the bit line having a larger difference in level becomes larger, the bit line patterning can be made easy.

In addition, since the space between the adjacent bit lines becomes larger, it is not necessary to use the self-alignment process for forming the storage electrode contact, thereby significantly increasing the degrees of freedom of the material of the bit line and the structure of films formed on the bit line.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 16 is a view for illustrating the manufacturing process of an environment circuit section other than the memory cell section of a dynamic semiconductor memory device according to the layout of FIG. 6;

DETAILED DESCRIPTION OF THE PREFERRED EMBODIMENTS

There will now be described an embodiment of the present invention with reference to the accompanying drawings.

Figure 1:
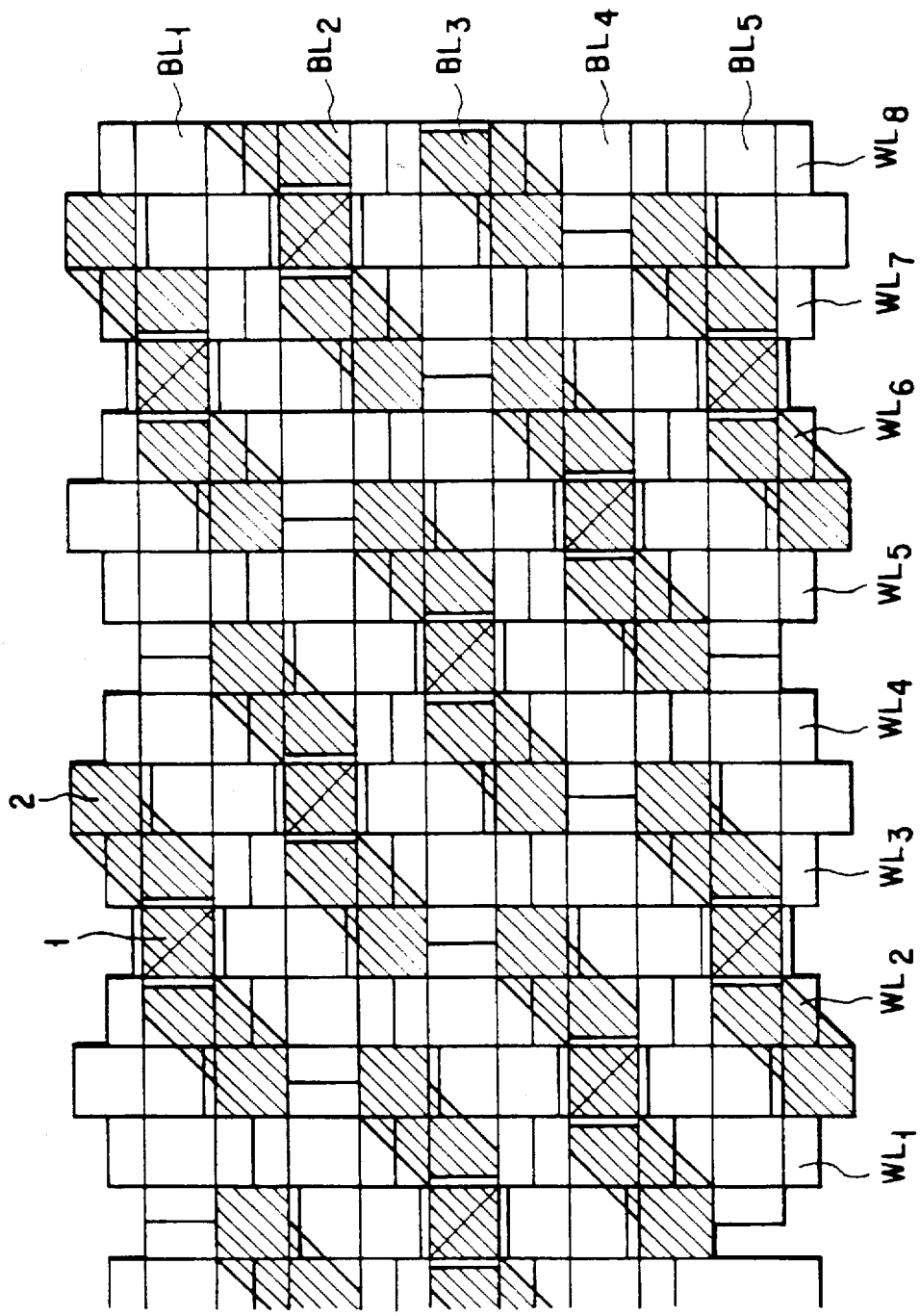
FIG. 1 is a view showing the layout of a conventional folded bit line configuration.
Figure 2:
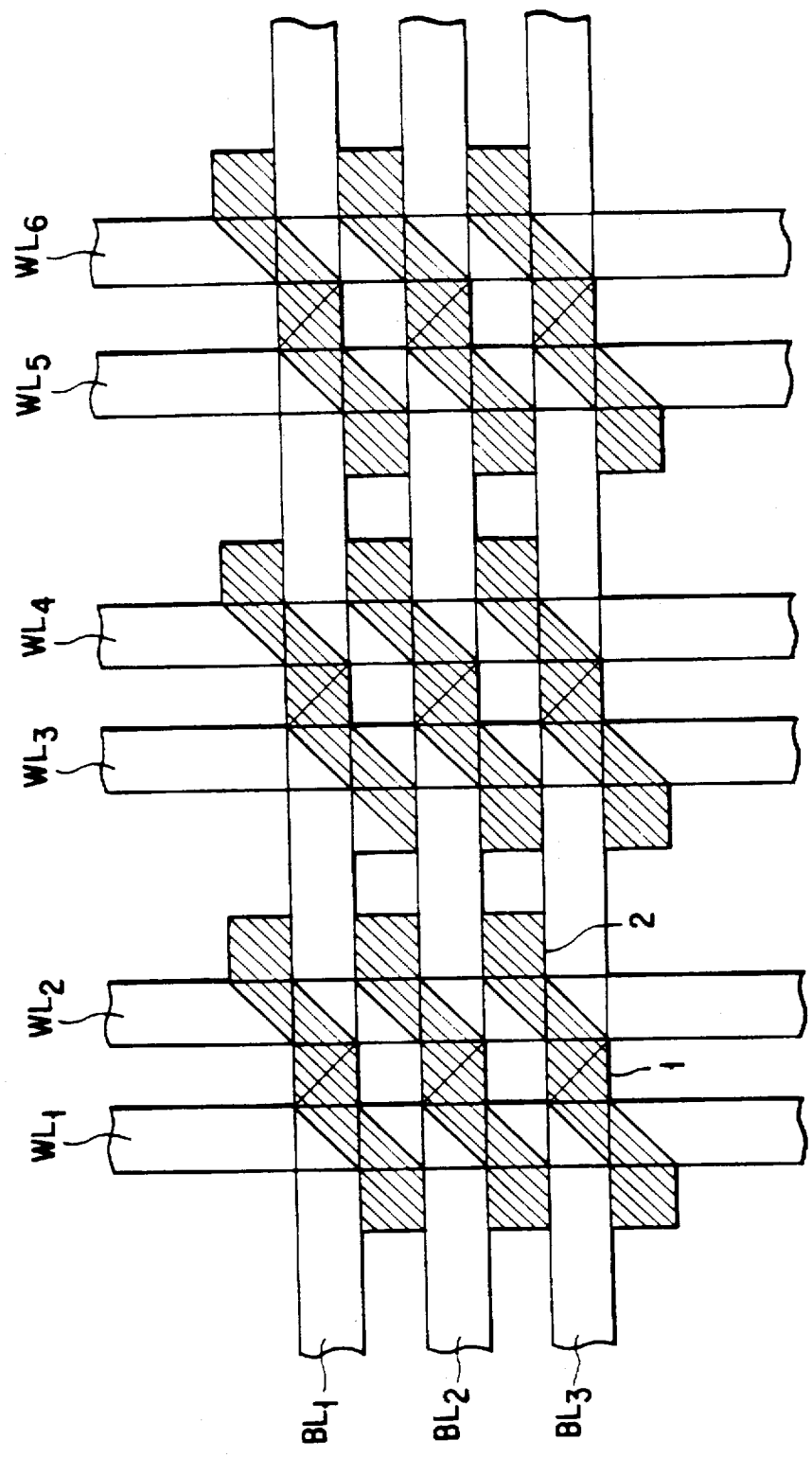
FIG. 2 is a view showing the layout of a conventional open bit line configuration.
Figures 3, 4:
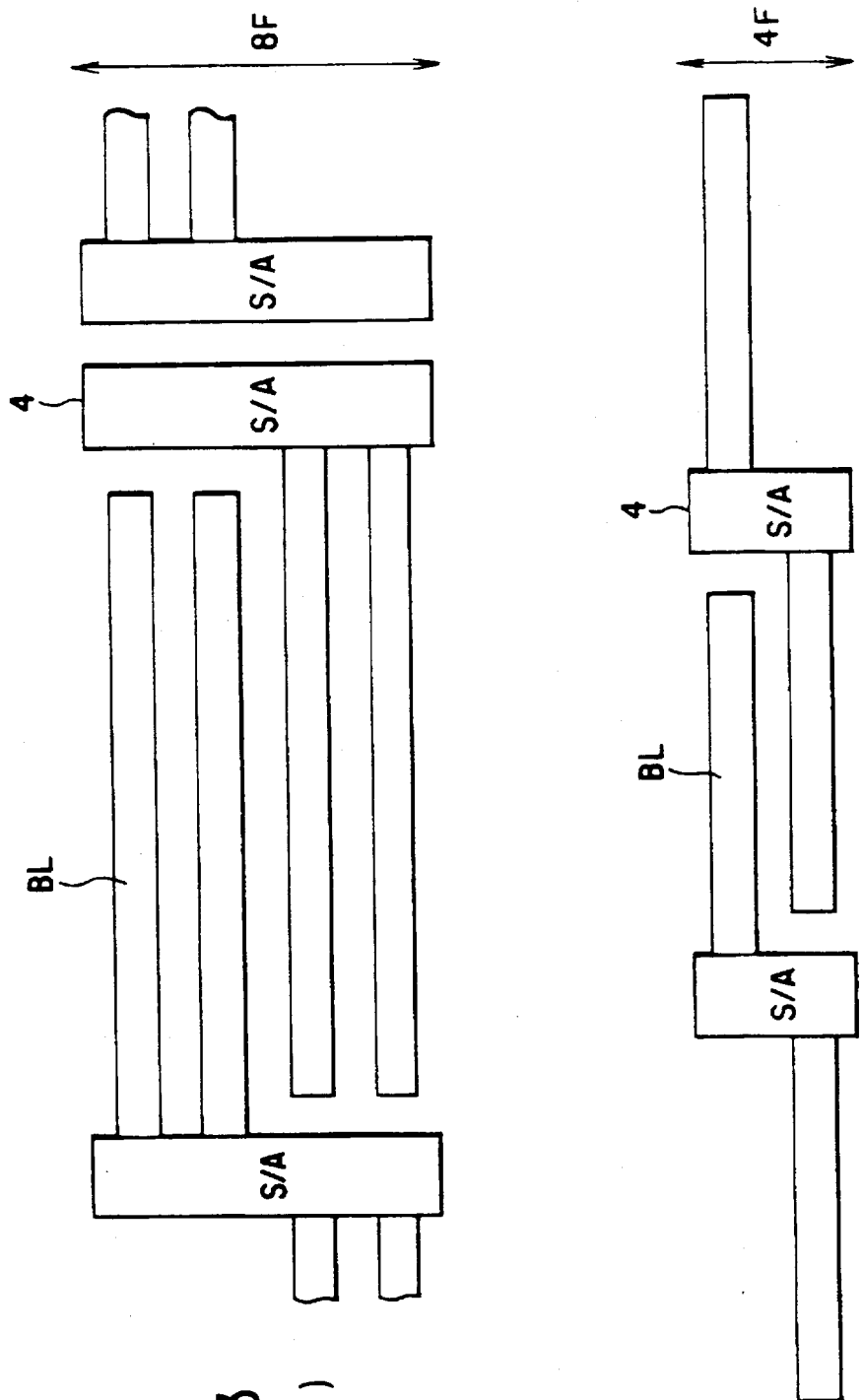
FIG. 3 is a view showing the arrangement of sense amplifiers in the layout of a conventional folded bit line configuration.
FIG. 4 is a view showing the arrangement of sense amplifiers in the layout of a conventional open bit line configuration.
Figure 5:
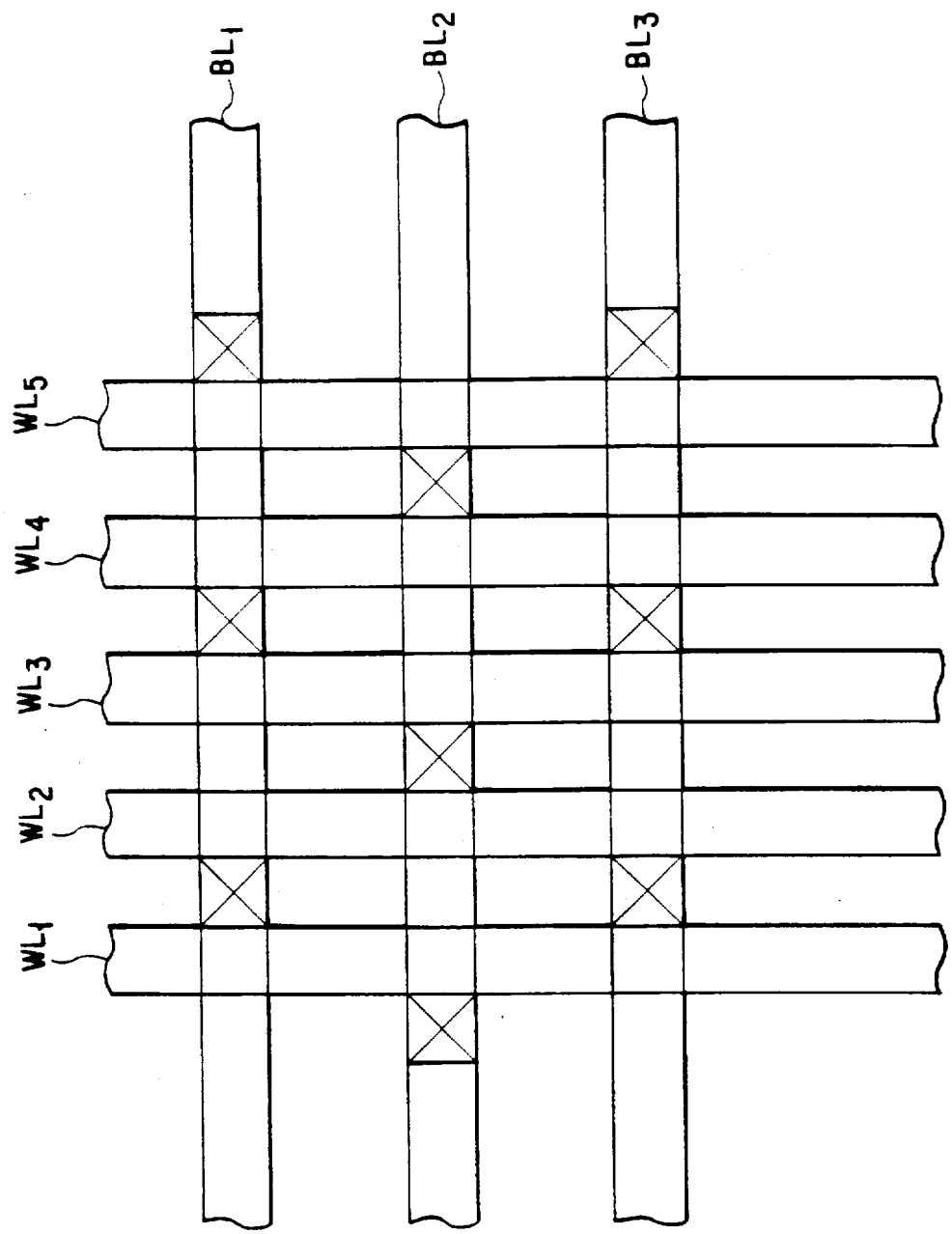
FIG. 5 is a view showing the arrangement of bit line contacts of a dynamic semiconductor memory device according to one embodiment of the present invention.

FIG. 5 is a view showing the arrangement of bit line contacts of a dynamic semiconductor memory device (which is hereinafter referred to as a DRAM) according to one embodiment of the present invention.

The DRAM of FIG. 5 includes a plurality of word lines $WL_1$ to $WL_5$ (which are denoted by WL when simply indicating a word line) arranged in parallel on a semiconductor substrate (not shown) and a plurality of bit lines $BL_1$ to $BL_3$ (which are denoted by BL when simply indicating a bit line) arranged in parallel to intersect the word lines WL.

Bit line contacts 1 are arranged on the respective bit lines BL between the word lines WL. In the present invention, as shown in FIG. 5, the bit line contacts 1 formed on the bit line BL are arranged at every other space with each of them lying between corresponding two adjacent word lines and the bit line contacts 1 formed on the adjacent bit line are arranged at every other space between corresponding adjacent word lines at which the former bit line contacts are not arranged. That is, the bit line contacts 1 formed on the bit lines $BL_1$ and $BL_3$ are arranged at spaces between the word lines $WL_1$ and $WL_2$, $WL_3$ and $WL_4$ and $WL_5$ and $WL_6$ (not shown). The bit line contacts 1 formed on the bit line $BL_2$ which is adjacent to the bit lines $BL_1$ and $BL_3$ are arranged at spaces between the word lines at which the bit line contacts 1 formed on the bit lines $BL_1$ and $BL_3$ are not arranged, that is, spaces between the adjacent word lines $WL_2$ and $WL_3$, $WL_4$ and $WL_5$, $WL_0$ and $WL_1$ not shown).

In FIG. 5, a space between the adjacent bit lines BL is larger than a space between the adjacent word lines WL and the space between the adjacent bit lines BL is set to 1.5 times the space between the adjacent word lines WL. The bit lines BL and the word lines WL are arranged to intersect each other.

As described above, the space between the adjacent word lines WL and the space between the adjacent bit lines BL are set to constant values, the bit line contacts 1 formed on one bit line BL are arranged in positions between respective adjacent word lines WL at every two word line pitches and the bit line contacts 1 formed on a bit line BL adjacent to the above bit line BL are arranged in positions between the respective adjacent word lines WL which are deviated from the above positions by one word line pitch and which are set at every two word line pitches. Therefore, when the closest filling is effected according to the layout of the cell array of the present invention, the minimum area of the cell is set to one word line pitch (2F)×1.5 bit line pitch (3F)=6F².

According to the present invention, the bit line space can be maintained at 2F which is twice the minimum featuring size while the minimum cell area is kept at 6F² which is the same as the minimum cell area in the conventional open bit line configuration. Therefore, according to the present invention, the sense amplifier arrangement space which can be set only to 4F in the conventional open bit line configuration can be set to 6F which is 1.5 times that of the layout of cell arrays of conventional open bit line configuration. Further, since the bit lines and word lines are arranged at equal intervals, precise patterning and processing can be attained.

When the closest filling is effected according to the layout of FIG. 5, a space between the adjacent bit lines becomes twice that between the adjacent word lines, but since the pitch of the bit line having a larger difference in level becomes larger, bit line patterning can be made easy.

In addition, according to the present invention, since the space between the adjacent bit lines becomes larger, it is not necessary to use the self-alignment process for forming the storage electrode contact, thereby significantly increasing the degrees of freedom of the material of the bit line and the structure of films formed on the bit line.

Figure 6:
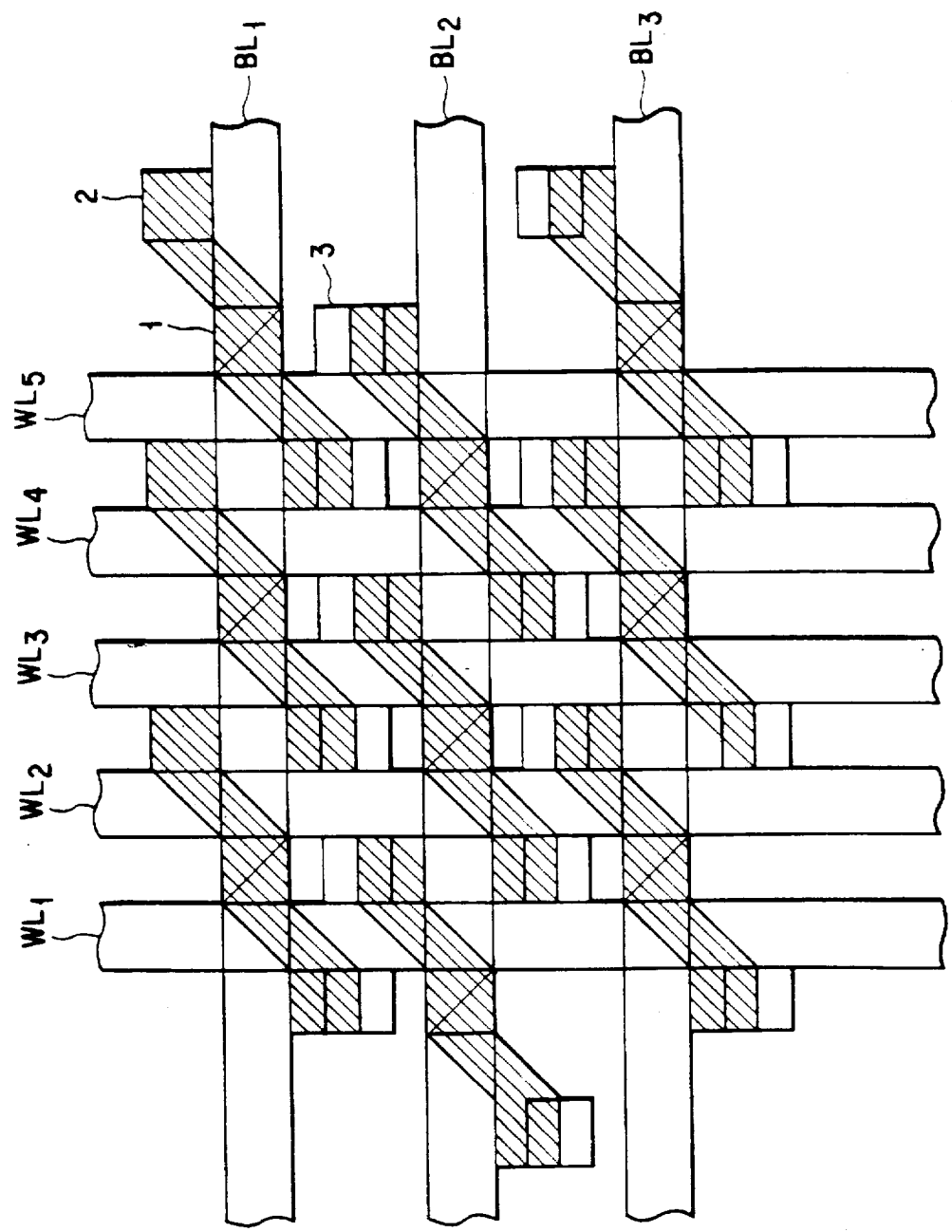
FIG. 6 is a view showing one example of the layout of the cell arrays in the arrangement of the bit line contacts of FIG. 5.
Figure 7:
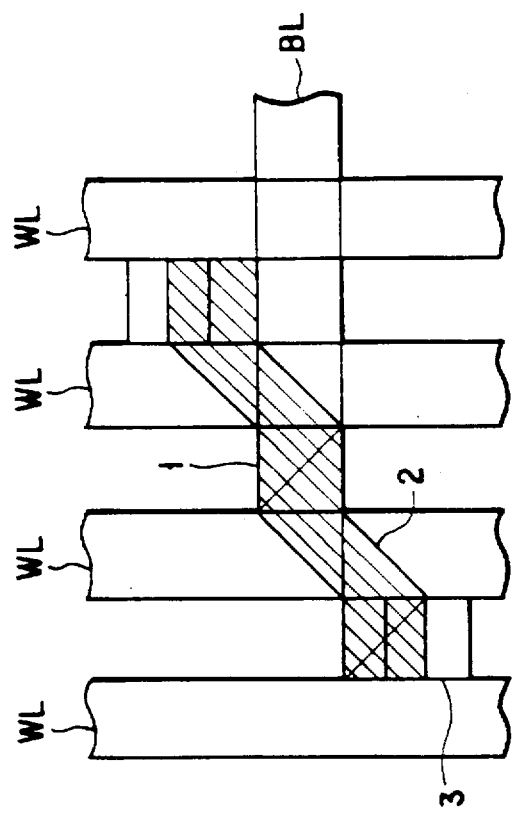
FIG. 7 is a view showing a selected one of the cell arrays of FIG. 6.
Figure 8:
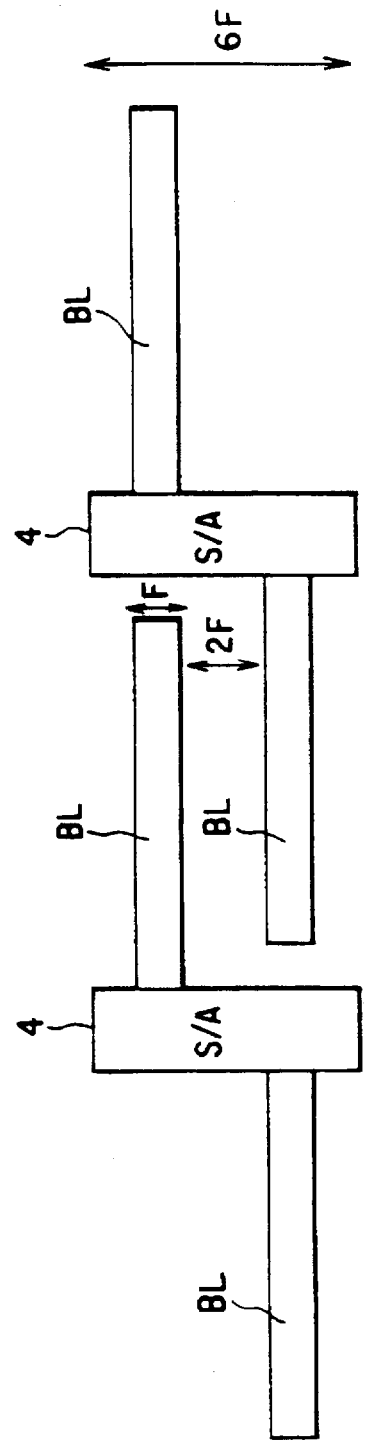
FIG. 8 is a view showing the arrangement of sense amplifiers in the cell array of FIG. 6.

One example of an actual layout of the cell array based on the arrangement of the bit line contacts 1 shown in FIG. 5 is shown in FIG. 6. In FIG. 6, the hatched portion indicates an active region 2. According to FIG. 6, the storage electrode contact 3 can be formed between the bit line BL with a margin of 0.5F. In FIG. 7, one of the cell arrays of FIG. 6 is shown. FIG. 8 is a view showing the arrangement of sense amplifiers in the cell array of FIG. 6.

A method of manufacturing the DRAM shown in FIG. 6 is explained with reference to FIGS. 9A to 16. FIGS. 9A, 10A, 11A, 12A, 13A, 14A and 15 are cross sectional views of the active region 2 of FIG. 6 and FIGS. 9B, 10B, 11B, 12B, 13B, 14B and 16 show an environment circuit section containing a transistor except the active region of FIG. 6.

Figure 9A:
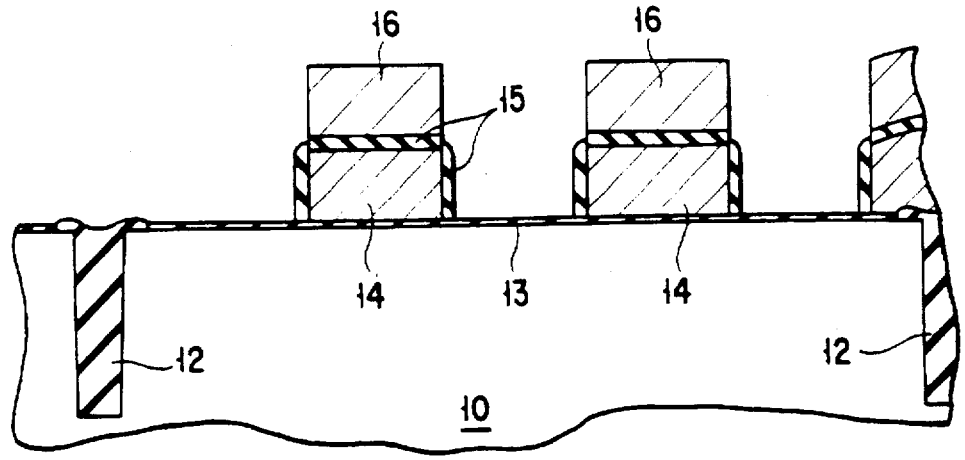
FIGS. 9A and 9B are views for illustrating the manufacturing process of a dynamic semiconductor memory device according to the layout of FIG. 6.
Figure 9B:
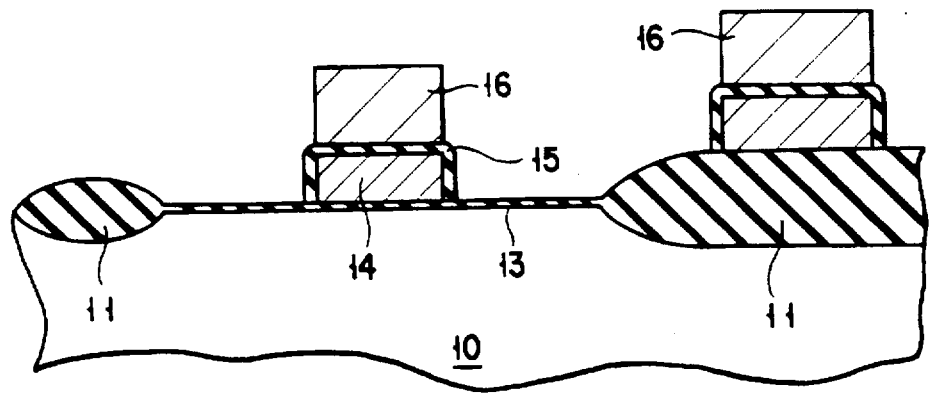

As shown in FIG. 9B, a field oxide 11 is formed by the LOCOS method in the peripheral circuit section other than the active region 2 in which a cell section is formed on the semiconductor substrate 10. After this, as shown in FIG. 9A, an isolation trench 12 is formed in the cell section and an SiO₂ film is formed in the isolation trench 12 by the CVD method to complete the field isolation. Then, a gate oxide film 13 is formed on the semiconductor substrate 10, a gate electrode polysilicon layer 14 is formed thereon and the semiconductor structure is subjected to thermal oxidation to form an oxide 15 thereon, and an SiN film 16 is formed on the oxide. After this, a gate is formed by etching and then oxides 15 are formed on the side surfaces of the gate polysilicon layers 14 to form gate electrodes 14 which are used as word lines.

Next, LDD implantation is effected and n⁺ implantation is effected in the peripheral circuit section without removing the side walls of polysilicon, and then the side walls of polysilicon are removed by the CDE method. After this, a polysilicon layer 16 used as an etching stopper is formed so as to provide an inter-layer dielectric film (which is hereinafter referred to as a BPSG film) 18 on the gate electrode 14. Then, the BPSG film 18 is subjected to the polishing process so as to make the upper surface of the word line flat. Further, after an SiO₂ film is formed by the CVD method, a contact hole 20 for forming a plug for the lower portion of the storage electrode contact with the polysilicon layer 16 used as a stopper. After the polysilicon layer 16 in the contact hole 20 is removed by the CDE method, an SiN film 21 is formed to leave the side wall and expose the substrate (FIGS. 10A and 10B).

Figure 10A:
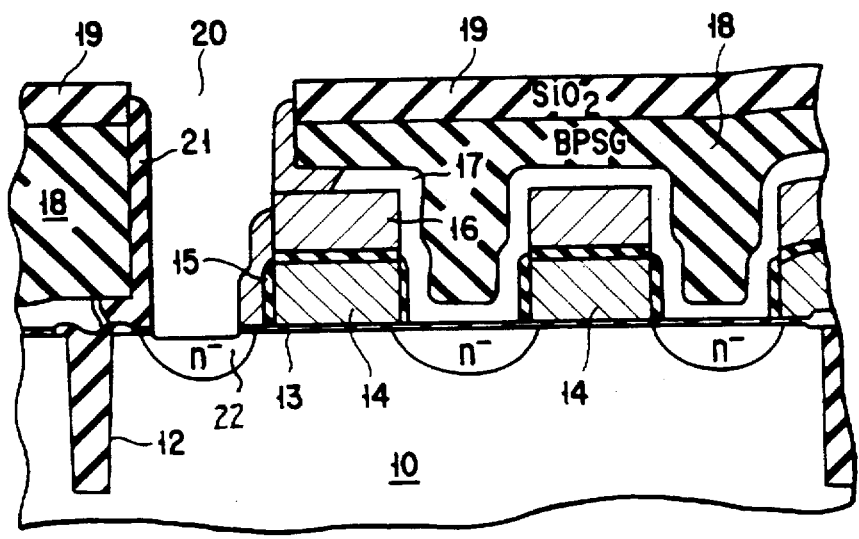
FIGS. 10A and 10B are views for illustrating the manufacturing process of a dynamic semiconductor memory device according to the layout of FIG. 6.
Figure 10B:
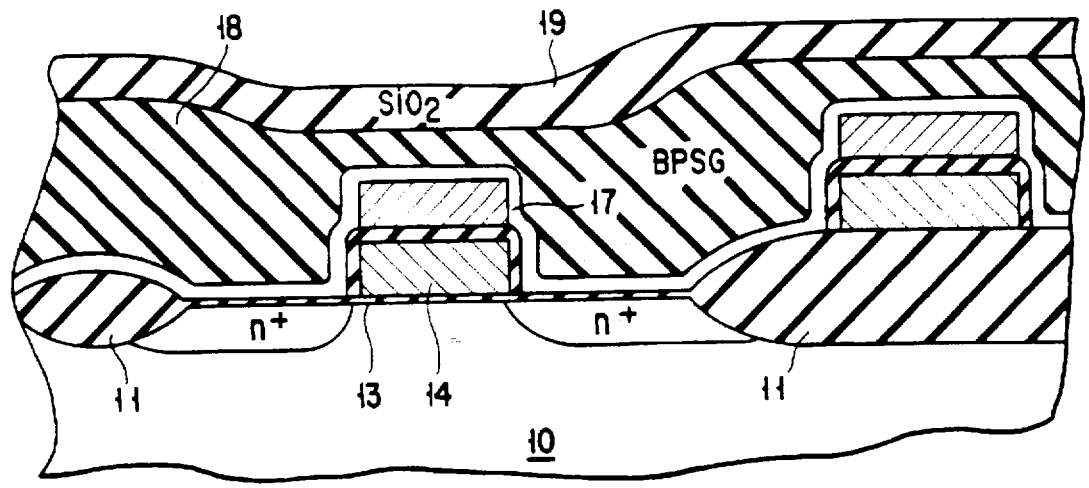
Figure 11A:
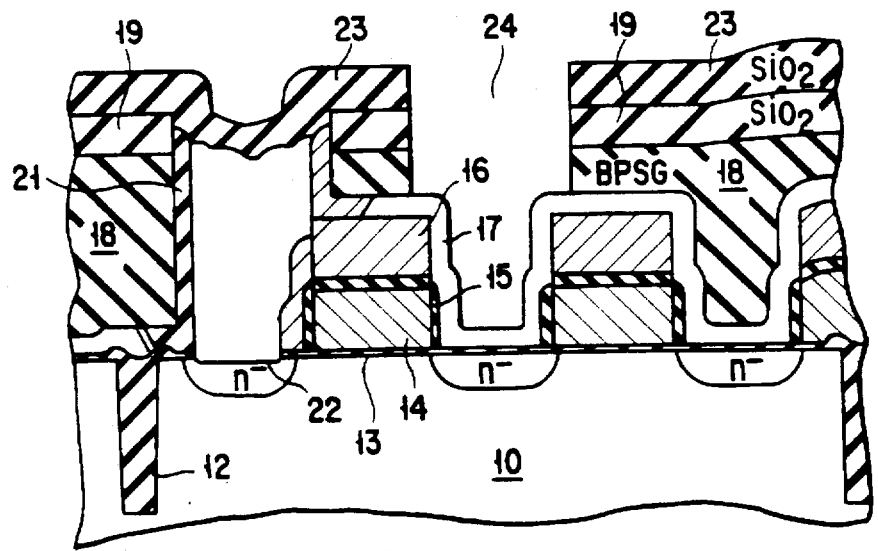
FIGS. 11A and 11B are views for illustrating the manufacturing process of a dynamic semiconductor memory device according to the layout of FIG. 6.
Figure 11B:
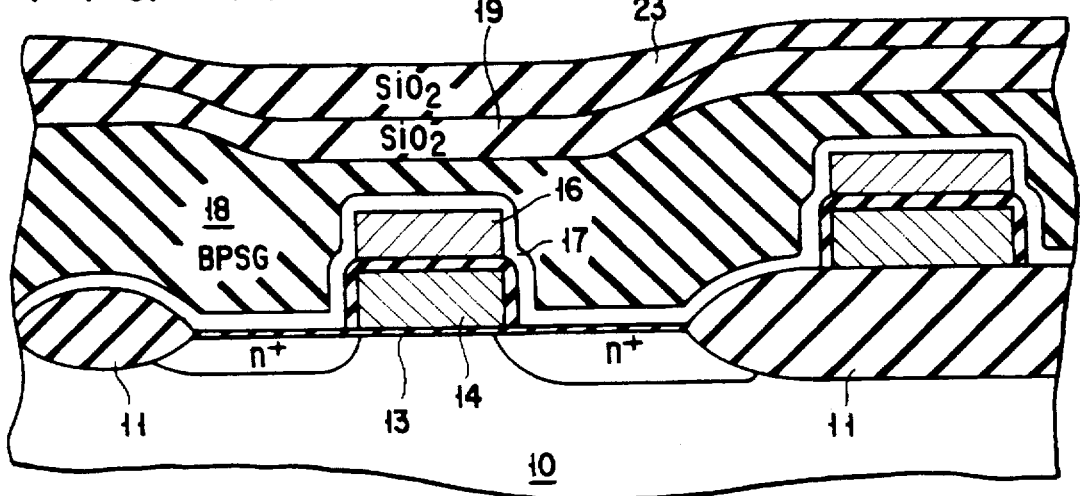

After a polysilicon layer 22 is deposited in two different steps in the contact hole 20 formed as shown in FIG. 10A (at this time, implantation to the polysilicon layer 22 is effected after formation of the polysilicon layer), the polysilicon layer 22 is etched back by the entire surface RIE so as to be left behind only in the hole, thus forming storage charge contact plug. At this time, an SiO₂ film 23 is formed by the CVD method to cover the plug. After this, a bit line contact 24 is formed in the same manner as the method for forming the contact hole 20 with the polysilicon layer 17 used as a stopper (FIGS. 11A and 11B).

Figure 12A:
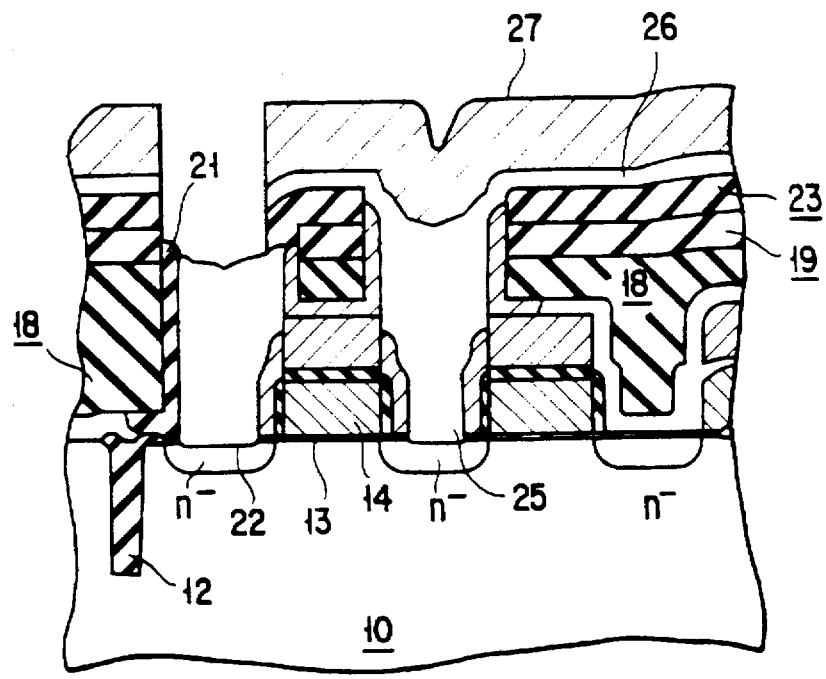
FIGS. 12A and 12B are views for illustrating the manufacturing process of a dynamic semiconductor memory device according to the layout of FIG. 6.
Figure 12B:
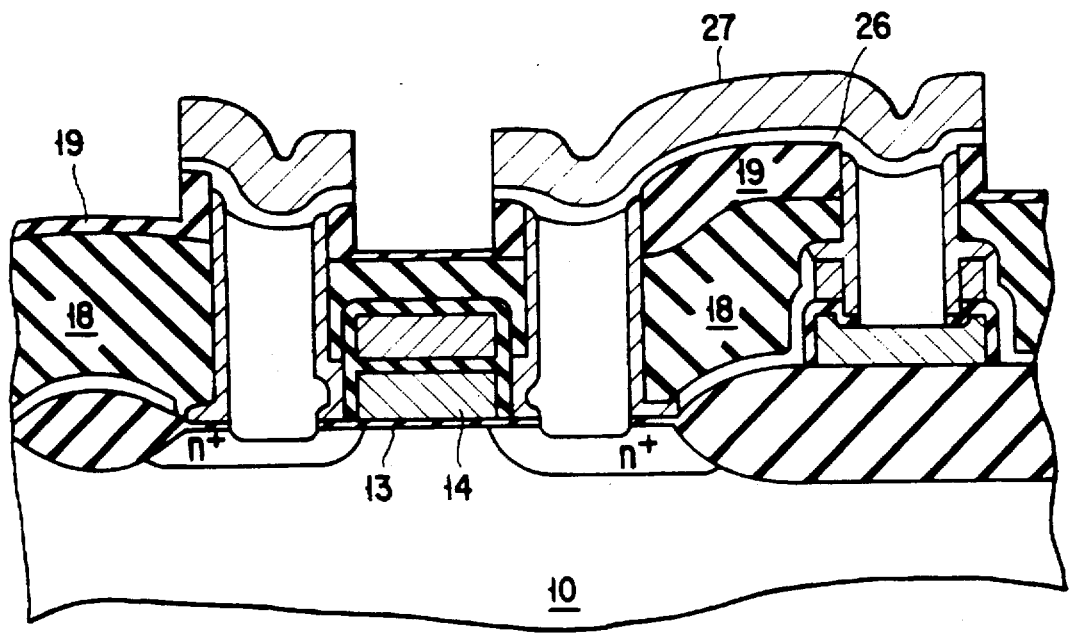

The bit line contact 24 is provided by forming a polysilicon layer 25 in a two-laminated form by effecting the same step as the step of forming the storage charge contact plug 22. After a WSi 27 used as a buried bit line is laminated by use of polysilicon 26, bit line patterning is effected (FIGS. 12A and 12B).

Figure 13A:
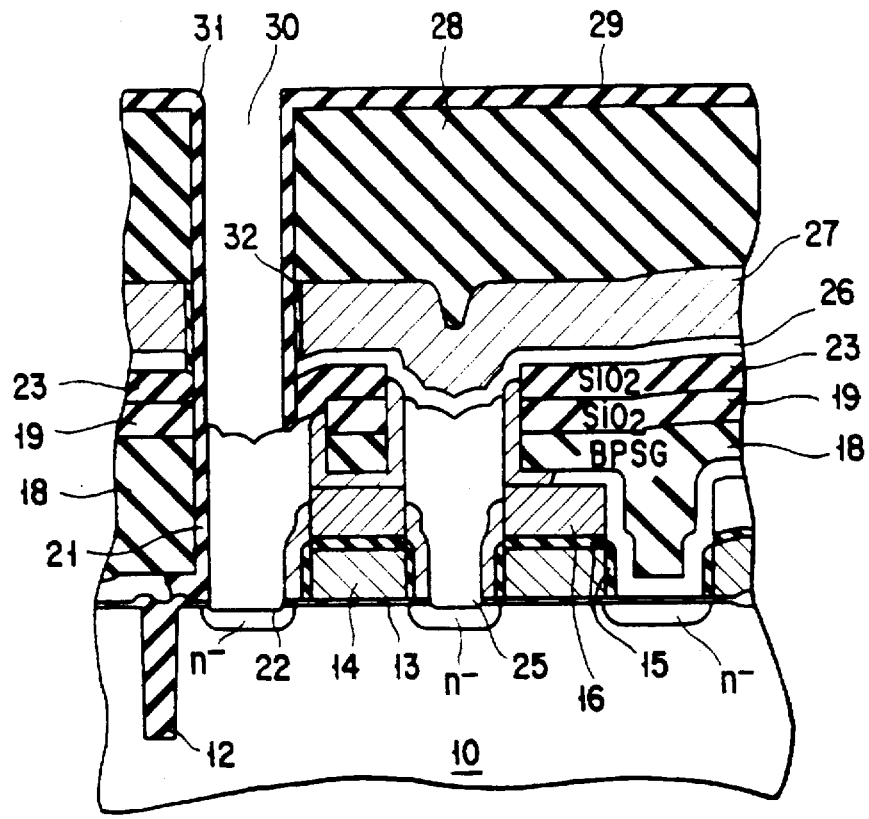
FIGS. 13A and 13B are views for illustrating the manufacturing process of a dynamic semiconductor memory device according to the layout of FIG. 6.
Figure 13B:
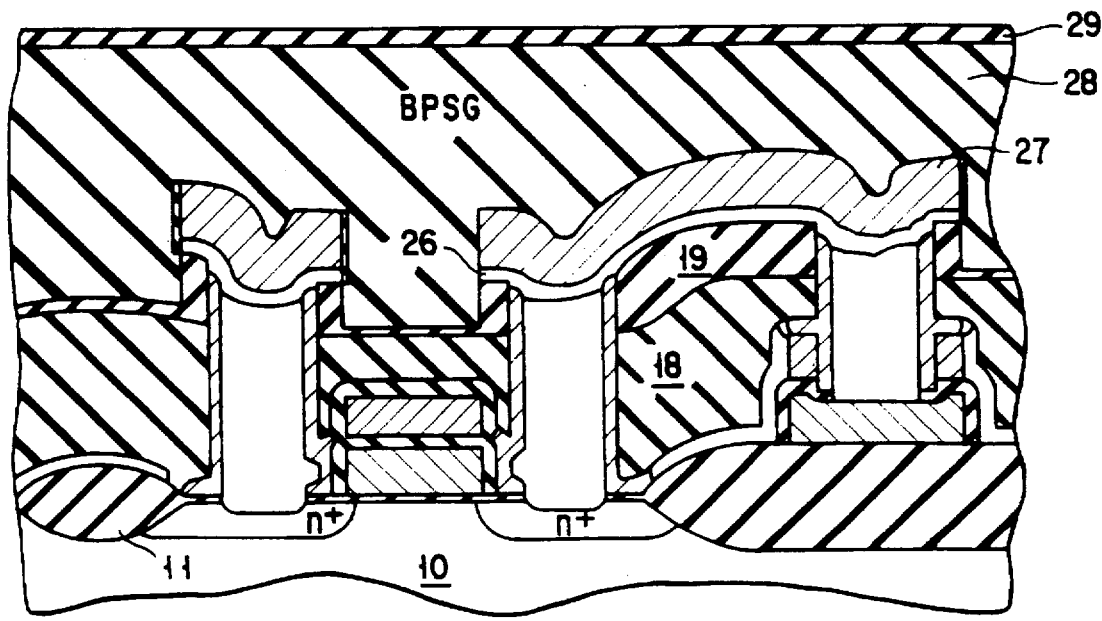

After a BPSG film 28 is laminated on the bit line, second polishing is effected to make a portion of the bit line having a difference in level flat. When an SiN film 29 is formed, a storage charge contact 30 is formed to extend towards the storage charge contact plug 22. At this time, the patterning of the bit line can be effected by mask alignment without using the self-alignment process. Isolation between the storage charge contact and WSi 27 (bit line) is attained by use of an oxidation film 32 formed by thermal oxidation of the side wall of the WSi 27 and an SiN film 31 having the side wall left behind (FIGS. 13A and 13B).

Figure 14A:
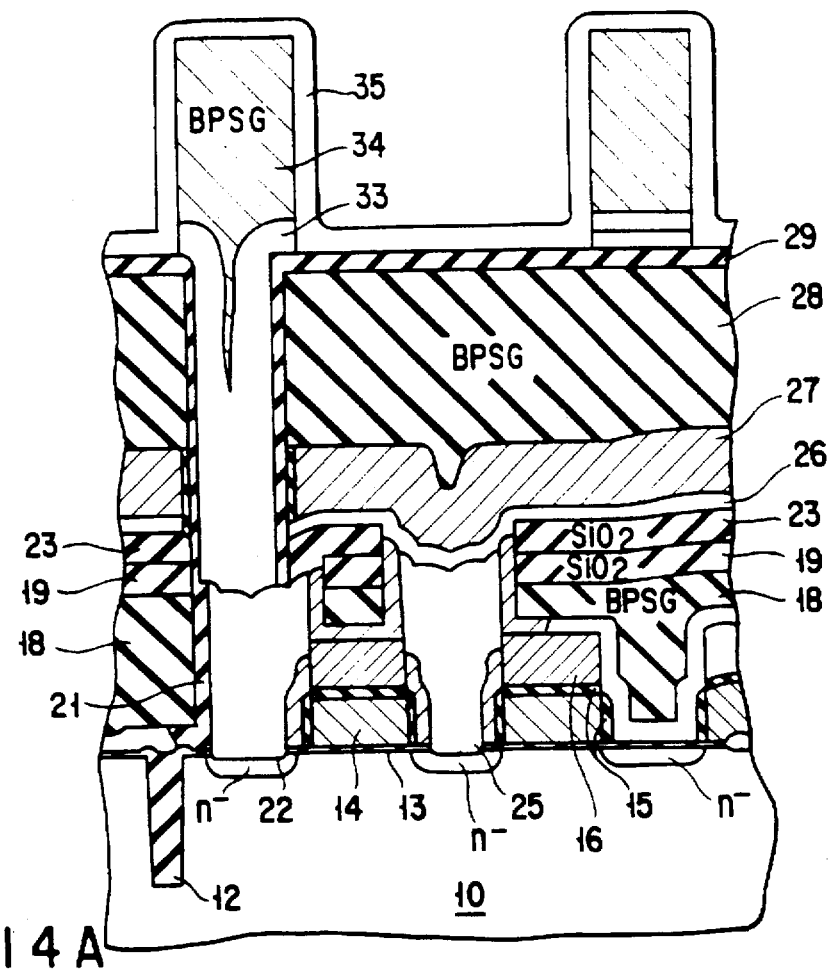
FIGS. 14A and 14B are views for illustrating the manufacturing process of a dynamic semiconductor memory device according to the layout of FIG. 6.
Figure 14B:
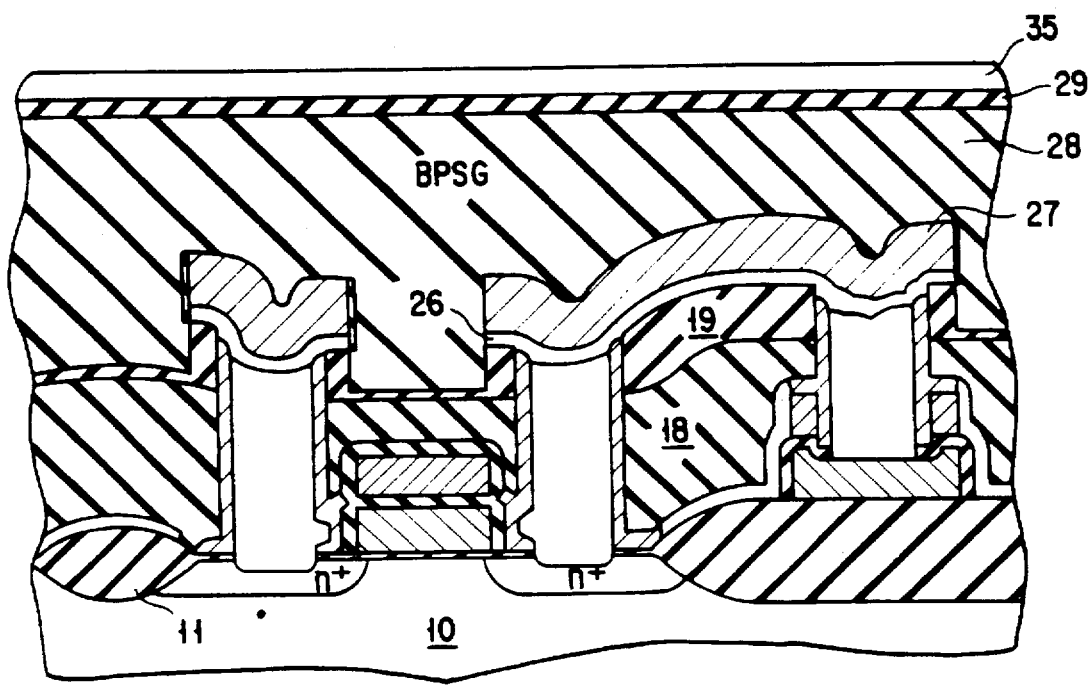

Further, polysilicon 33 is deposited twice in the storage charge contact plug 30, a storage charge contact is formed thereon and then a BPSG film 34 is formed. After the film is processed into a cylindrical form used as the center of a cylindrical storage node, a polysilicon layer 35 used as a storage charge contact is formed on the film (FIGS. 14A and 14B).

Figure 15:
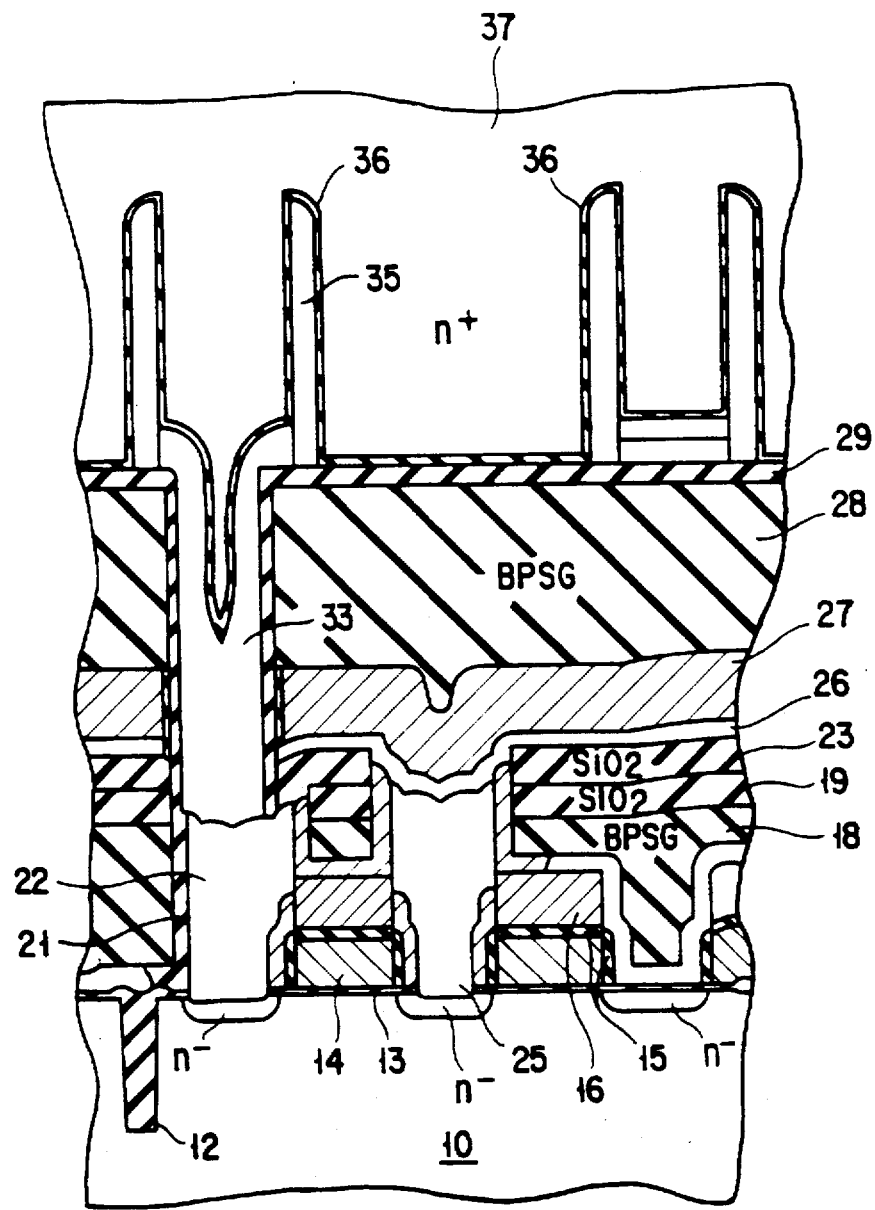
FIG. 15 is a view for illustrating the manufacturing process of a memory cell section of a dynamic semiconductor memory device according to the layout of FIG. 6.

Only a portion of the silicon layer 35 which lies on the outer side surface of the BPSG film 34 is left behind by the entire surface RIE and the BPSG film 34 is removed by a wet etching process such as NH₄F etching, then a cylindrical form storage node contact 35 is formed. A combination film 36 of SiN and SiO₂ used as a capacitor insulation film is formed on the surface of the storage node contact 35 and a plate polysilicon layer 37 is formed to reduce a step height of the storage node, thus completing a capacitor (FIG. 15).

Next, the wiring process is explained by use of the peripheral circuit section. After the plate 37 is formed as shown in FIG. 16, the BPSG film 38 is made flat by the third polishing and then a contact is formed.

By the above step, all of the contacts are connected to an aluminum layer 39 of first-layer wiring via the WSi layer 27, and connection between the WSi layer 27 and the first-layer aluminum wiring layer 39 is attained by use of a tungsten plug 40 formed by selective growth. Also, connection between a second-layer aluminum wiring layer 42 and the first-layer aluminum wiring layer 39 is attained by use of a tungsten plug 41 formed by selective growth.

The fourth polishing may be effected to make the surface flat before forming a through hole used for connection between the second-layer aluminum wiring layer 42 and the first-layer aluminum wiring layer 39.

This invention is not limited to the above embodiment.

The layout of cell arrays is not limited to the layout shown in FIG. 6 and can be variously modified if the arrangement of the bit line contacts 1 is made as shown in FIG. 5.

Figure 17:
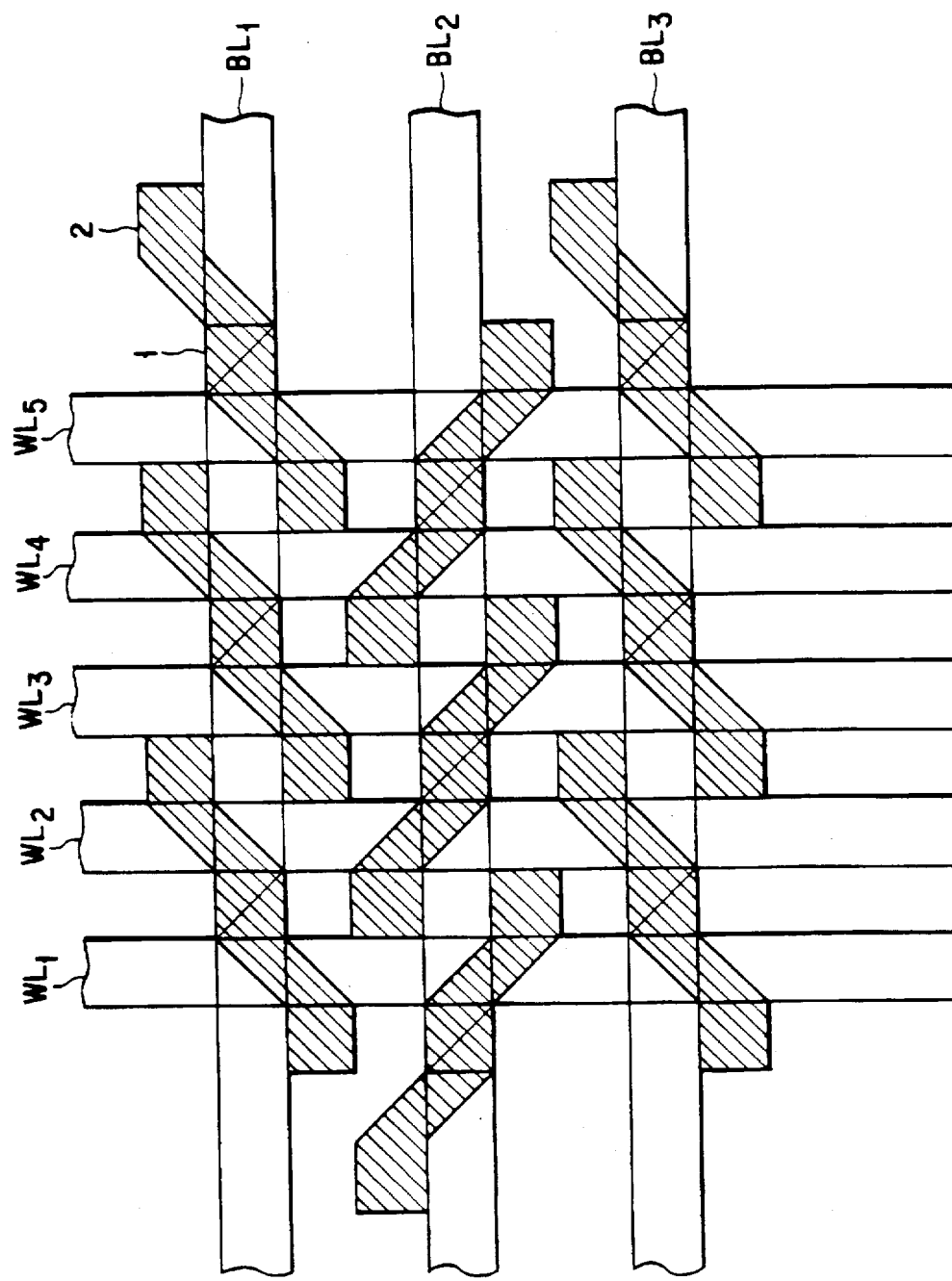
FIG. 17 is a view of a first modification of the layout of cell arrays of the dynamic semiconductor memory device FIG. 6.
Figure 18:
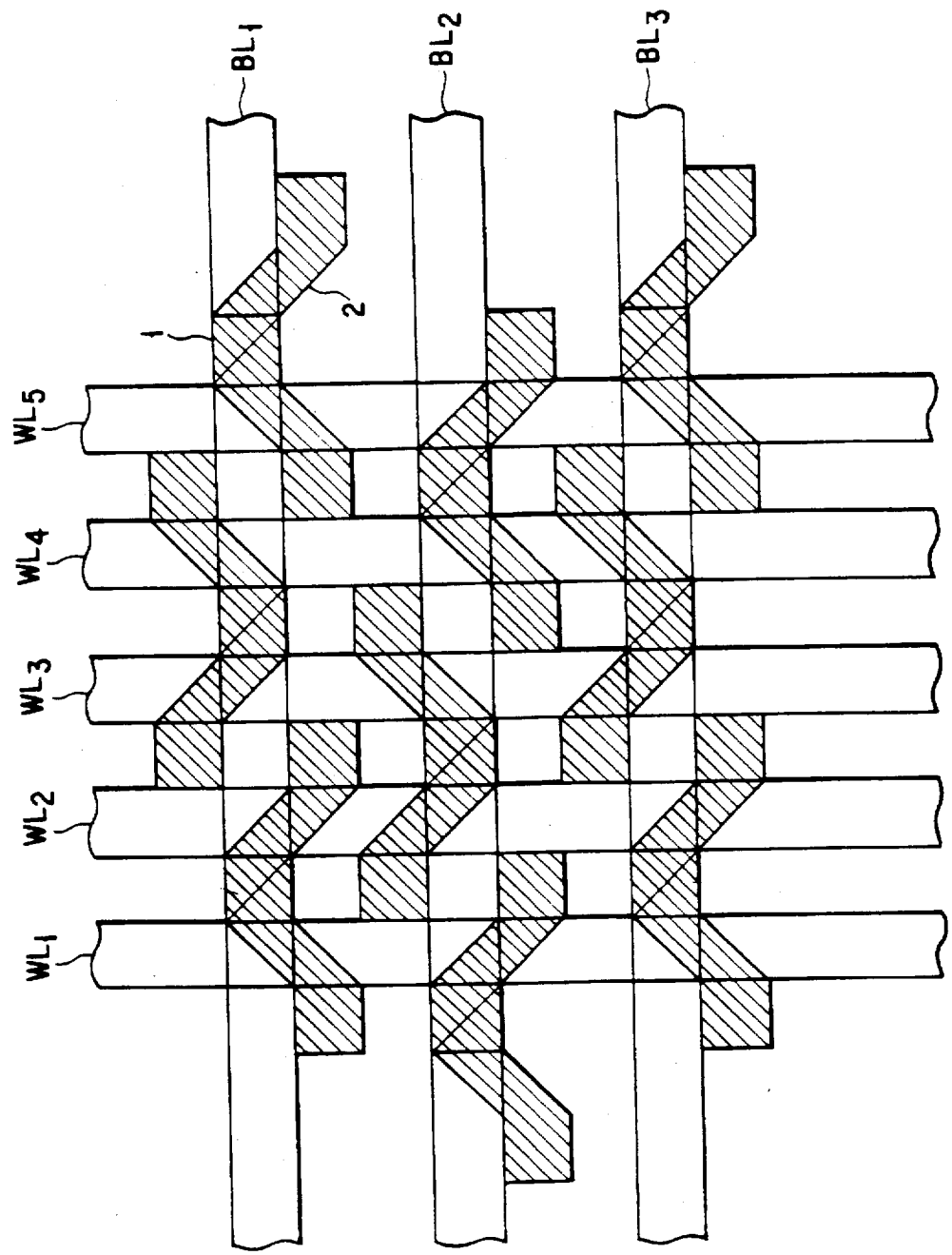
FIG. 18 is a view of a second modification of the layout of cell arrays of the dynamic semiconductor memory device of FIG. 6.

For example, first and second modifications of the layout of cell arrays of FIG. 6 are shown in FIGS. 17 and 18 as a modifications of the case of FIG. 6.

In the modifications shown in FIGS. 17 and 18, the position of the bit line contacts 1 is the same as that of FIG. 6 and only the layout of the active region is changed.

FIG. 17 shows the layout obtained by rotating the active region by 180° with the bit line contacts 1 set as the center without changing the shape of the active region in the layout of FIG. 6.

FIG. 18 shows the layout obtained by changing the shape of the active region from the stepped form shown in FIG. 6 to a saddle shape or the like.

In the modifications of FIGS. 17 and 18, since the arrangement of the bit line contacts 1 is the same as that of FIG. 6, the same effect as that of FIG. 6 can be obtained.

Further, the layout may be obtained by combining the shape of the active region of FIG. 6 with the shape of the active region of FIG. 18, and in this case, the same effect as that of the above embodiment can be attained.

In addition, the present invention can be variously modified without departing from the technical scope thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device, comprising:

a semiconductor substrate;

a plurality of word lines arranged to extend in a first direction along the semiconductor substrate;

a plurality of bit lines arranged to extend in a second direction, perpendicular to the first direction, along the semiconductor substrate;

a bit line contact formed between first and second adjacent word lines;

a first storage node contact formed adjacent the first word line, and a second storage node contact formed adjacent the second word line, the first and second storage node contacts forming storage capacitors.

2. The semiconductor device according to claim 1, wherein the bit line contact includes a polysilicon layer.

3. The semiconductor device according to claim 1, further comprising a BPSG film laminated on the bit line.

4. The semiconductor device according to claim 2, further comprising a BPSG film laminated on the bit line.

5. The semiconductor device according to claim 1, further comprising a capacitor storage film formed on the first and second storage node contacts.

6. The semiconductor device according to claim 5, further comprising a plate polysilicon layer covering the capacitor storage film.

7. The semiconductor device according to claim 2, further comprising a capacitor storage film formed on the first and second storage node contacts.

8. The semiconductor device according to claim 7, further comprising a plate polysilicon layer covering the capacitor storage film.

9. The semiconductor device according to claim 1, further comprising an isolation trench formed in the semiconductor substrate.

10. The semiconductor device according to claim 1, further comprising a storage charge contact plug filled with polysilicon formed adjacent the first word line, the polysilicon extending to the first storage node contact.

11. A dynamic semiconductor memory device, comprising:

a semiconductor substrate;

a plurality of memory cells each formed of a MOS transistor and a capacitor which is formed on said semiconductor substrate and has a storage node contact;

a plurality of word lines formed on said semiconductor substrate, spaces being provided between adjacent word lines and including odd-numbered and even-numbered spaces;

a plurality of bit lines formed on said semiconductor substrate to intersect said word lines, said bit lines including odd-numbered and even-numbered bit lines; and a plurality of bit line contacts formed under said bit lines with each respective bit line contact being commonly used by two respective memory cells of said plurality of memory cells, two respective storage node contacts of said two respective memory cells connected to each respective bit line contact being arranged across each bit line connected to said respective bit line contact, a combination of each respective bit line contact and said two memory cells forming an element region, those of said bit line contacts which electrically connect to said even-numbered bit lines to said memory cells being arranged in said even-numbered spaces and those of said bit line contacts which electrically connect to said odd-numbered bit lines to said memory cells being arranged in said odd-numbered spaces, wherein respective element regions are arranged in parallel, said storage node contact of one of said two memory cells connected to a first bit line contact and said storage node contact of one of said two memory cells connected to a second bit line contact, which is formed under the same bit line as said first bit line contact and is adjacent thereto, are arranged across the bit line, and said storage node contacts of said memory cells, which are respectively connected to an adjacent two of said bit line contacts connected to the same bit line and which are respectively connected to an adjacent two of said word lines, are arranged to sandwich the same bit line, and are arranged at the same space between said adjacent two of said word lines.

12. The dynamic semiconductor memory device according to claim 11, wherein said bit lines and word lines are respectively arranged at predetermined spaces.

13. The dynamic semiconductor memory device according to claim 11, wherein said bit lines and said word lines perpendicularly intersect each other.

14. The dynamic semiconductor memory device according to claim 11, wherein a pitch of adjacent bit lines is larger than a pitch of adjacent word lines.

15. The dynamic semiconductor memory device according to claim 14, wherein the pitch of adjacent bit lines is 1.5 times the pitch of adjacent word lines.

16. A dynamic semiconductor memory device according to claim 11, wherein
said memory cells are formed in an active region which is electrically separated by an element isolation layer,
a pair of said word lines which are electrically independent passing through said active region, and
a transfer region is formed at a cross point of said active region and one of said word lines.

17. A dynamic semiconductor memory device according to claim 16, wherein
one of said bit line contacts and two storage node contacts are formed in said active region, and
one of said bit line contacts is arranged by crossing said word lines.

18. A dynamic semiconductor memory device, comprising:
a semiconductor substrate;
a plurality of memory cells each formed of a MOS transistor and a capacitor which is formed on said semiconductor substrate and has a storage node contact;
a plurality of word lines formed on said semiconductor substrate, spaces being provided between adjacent word lines and including odd-numbered and even-numbered spaces;
a plurality of bit lines formed on said semiconductor substrate to intersect said word lines, said bit lines including odd-numbered and even-numbered bit lines; and
a plurality of bit line contacts formed under said bit lines with each respective bit line contact being commonly used by two respective memory cells of said plurality of memory cells, two respective storage node contacts of said two respective memory cells connected to each respective bit line contact being arranged across each bit line connected to said respective bit line contact, a combination of each respective bit line contact and said two memory cells forming an element region, those of said bit line contacts which electrically connect to said even-numbered bit lines to said memory cells being arranged in said even-numbered spaces and those of said bit line contacts which electrically connect to said odd-numbered bit lines to said memory cells being arranged in said odd-numbered spaces, wherein
element regions of alternate bit lines are arranged in parallel and element regions of adjacent bit lines are alternately arranged,
said storage node contact of one of said two memory cells connected to a first bit line contact and said storage node contact of one of said two memory cells connected to a second bit line contact, which is formed under the same bit line as said first bit line contact and is adjacent thereto, are arranged across the bit line,
and said storage node contacts of said memory cells, which are respectively connected to an adjacent two of said bit line contacts connected to the same bit line and which are respectively connected to an adjacent two of said word lines, are arranged to sandwich the same bit line, and are arranged at the same space between said adjacent two of said word lines.

19. The dynamic semiconductor memory device according to claim 18, wherein said bit lines and word lines are respectively arranged at predetermined spaces.

20. The dynamic semiconductor memory device according to claim 18, wherein said bit lines and said word lines perpendicularly intersect each other.

21. The dynamic semiconductor memory device according to claim 18, wherein a pitch of adjacent bit lines is larger than a pitch of adjacent word lines.

22. The dynamic semiconductor memory device according to claim 21, wherein the pitch of adjacent bit lines is 1.5 times the pitch of adjacent word lines.

23. A dynamic semiconductor memory device according to claim 18, wherein
said memory cells are formed in an active region which is electrically separated by an element isolation layer,
a pair of said word lines which are electrically independent passing through said active region, and
a transfer region is formed at a cross point of said active region and one of said word lines.

24. A dynamic semiconductor memory device according to claim 23, wherein
one of said bit line contacts and two storage node contacts are formed in said active region, and
one of said bit line contacts is arranged by crossing said word lines.

25. A dynamic semiconductor memory device, comprising:
a semiconductor substrate;
a plurality of memory cells each formed of a MOS transistor and a capacitor which is formed on said semiconductor substrate and has a storage node contact;
a plurality of word lines formed on said semiconductor substrate, spaces being provided between adjacent word lines and including odd-numbered and even-numbered spaces;
a plurality of bit lines formed on said semiconductor substrate to intersect said word lines, said bit lines including odd-numbered and even-numbered bit lines; and
a plurality of bit line contacts formed under said bit lines with each respective bit line contact being commonly used by two respective memory cells of said plurality of memory cells, two respective storage node contacts of said two respective memory cells connected to each respective bit line contact being arranged at a same space between each bit line connected to said each respective bit line contact and a bit line adjacent thereto, those of said bit line contacts which electrically connect to said even-numbered bit lines to said memory cells being arranged in said even-numbered spaces and those of said bit line contacts which electrically connect to said odd-numbered bit lines to said memory cells being arranged in said odd-numbered spaces, wherein
said storage node contact of one of said two memory cells connected to a first bit line contact and said storage node contact of one of said two memory cells connected to a second bit line contact, which is formed under the same bit line as said first bit line contact and is adjacent thereto, are arranged across the bit line,
and said storage node contacts of said memory cells, which are respectively connected to an adjacent two of said bit line contacts connected to the same bit line and which are respectively connected to an adjacent of said word lines, are arranged to sandwich the same bit line, and are arranged at the same space between the adjacent two of said word lines.

26. The dynamic semiconductor memory device according to claim 25, wherein said bit lines and word lines are respectively arranged at predetermined spaces.

27. The dynamic semiconductor memory device according to claim 25, wherein said bit lines and said word lines perpendicularly intersect each other.

28. The dynamic semiconductor memory device according to claim 25, wherein a pitch of adjacent bit lines is larger than a pitch of adjacent word lines.

29. The dynamic semiconductor memory device according to claim 28, wherein the pitch of adjacent bit lines is 1.5 times the pitch of adjacent word lines.

30. A dynamic semiconductor memory device according to claim 35, wherein said memory cells are formed in an active region which is electrically separated by an element isolation layer, a pair of said word lines which are electrically independently passing through said active region, and a transfer region is formed at a cross point of said active region and one of said word lines.

31. A dynamic semiconductor memory device according to claim 30, wherein one of said bit line contacts and two storage node contacts are formed in said active region, and one of said bit line contacts is arranged by crossing said word lines.

* * * * *

UNITED STATES PATENT AND TRADEMARK OFFICE
CERTIFICATE OF CORRECTION

PATENT NO. : 5,747,844
DATED : May 5, 1998
INVENTOR(S) : MASAMI AOKI, et al.

It is certified that error appears in the above-identified patent and that said Letters Patent is hereby corrected as shown below:

On the title page, Item [*] the Terminal Disclaimer information, has been omitted. It should read:

-- The term of this Patent shall not extend beyond the expiration date of Pat. No. 5,578,847.--

Signed and Sealed this

Thirteenth Day of October 1998

*Attest:*

BRUCE LEHMAN

*Attesting Officer*   Commissioner of Patents and Trademarks